United States Patent [19]

Kittaka et al.

[11] Patent Number: 5,057,801
[45] Date of Patent: Oct. 15, 1991

[54] FILTER DEVICE OF PIEZO-ELECTRIC TYPE INCLUDING DIVIDED CO-PLANAR ELECTRODES

[75] Inventors: Toshihiko Kittaka; Akira Ando; Hiroshi Tamura, all of Nagaokakyo, Japan

[73] Assignee: Murata Mfg. Co. Ltd., Japan

[21] Appl. No.: 482,172

[22] Filed: Feb. 20, 1990

[30] Foreign Application Priority Data

Feb. 20, 1989 [JP] Japan .................................. 1-40661

[51] Int. Cl.5 .............................................. H03H 9/54
[52] U.S. Cl. .................................... 333/187; 333/191; 310/320; 310/366
[58] Field of Search ............................. 333/187–192; 310/320, 364, 366

[56] References Cited

U.S. PATENT DOCUMENTS

| | | | |
|---|---|---|---|
| 2,976,650 | 3/1961 | Mattiat | 333/187 X |
| 3,590,287 | 6/1971 | Berlincourt et al. | 310/366 |
| 3,961,210 | 6/1976 | Nagata et al. | 310/320 |
| 4,900,970 | 12/1990 | Ando et al. | 310/320 |
| 4,918,350 | 4/1990 | Ando et al. | 310/320 |
| 4,939,403 | 7/1990 | Kittaka et al. | 310/320 |

FOREIGN PATENT DOCUMENTS

| | | | |
|---|---|---|---|
| 609603 | 11/1960 | Canada | 333/187 |
| 58-85613 | 5/1983 | Japan . | |
| 58-85614 | 5/1983 | Japan . | |
| 144012 | 7/1985 | Japan | 333/191 |
| 4315 | 1/1986 | Japan | 333/191 |
| 65511 | 4/1986 | Japan | 333/187 |

Primary Examiner—Eugene R. LaRoche
Assistant Examiner—Benny Lee
Attorney, Agent, or Firm—Ostrolenk, Faber, Gerb & Soffen

[57] ABSTRACT

A piezoelectric filter device of an energy-trapped type utilizing a higher harmonic in the thickness-extensional vibration mode, having a plate-shaped body made of a piezoelectric material. At least three electrodes are arranged so as to overlap each other while being separated by layers of the piezoelectric material in the direction of thickness of the plate-shaped body. At least one of the electrodes comprises a plurality of divided electrodes which are substantially coplanar. At least one of the divided edlectrodes constitutes an input terminal and at least one of the remaining divided electrodes constitutes an output terminal. A region of the body, around the vibrating region, where the electrodes are overlapped with each other, is uniformly subjected to polarization processing in the direction of thickness.

7 Claims, 8 Drawing Sheets

FILTER DEVICE OF PIEZO-ELECTRIC TYPE INCLUDING DIVIDED CO-PLANAR ELECTRODES

BACKGROUND OF THE INVENTION

1. Field of the Invention

The present invention relates generally to a piezoelectric filter device of an energy-trapped type, and more particularly, to a monolithic filter device utilizing a higher harmonic in the thickness-extensional vibration mode.

2. Description of the Prior Art

Figure 1:
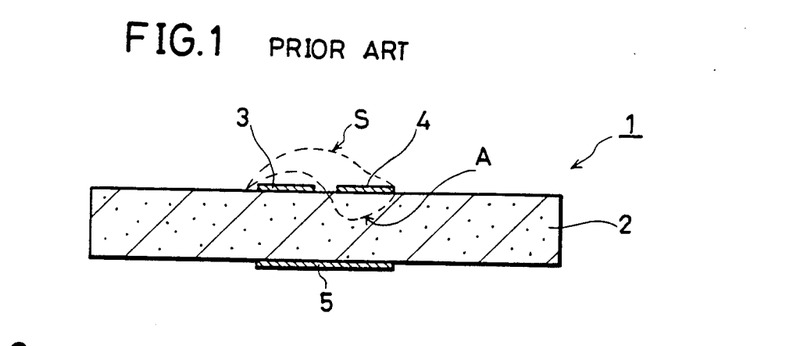
FIG. 1 is a cross sectional view for explaining an example of a conventional filter device.

FIG. 1 is a schematic cross sectional view showing an example of a conventional piezoelectric filter device of an energy-trapped type. In a filter device 1, electrodes 3 and 4 are formed spaced apart from each other by a predetermined distance on the upper surface of a piezoelectric ceramic plate 2 which has been subjected to polarization processing to polarize it in the direction of thickness, while a common electrode 5 is formed on the lower surface of the piezoelectric ceramic plate 2 so as to overlap the electrodes 3 and 4 while being separated therefrom by the thickness of the piezoelectric ceramic plate 2. The filter device 1 operates as a filter by using either one of the electrodes 3 and 4 as an input electrode and using the other as an output electrode and further, connecting the common electrode 5 to a ground potential.

In the filter device 1, a filter having frequency selectivity is constituted by a single element utilizing two modes, i.e., the A mode and the S mode (respectively represented by broken lines in FIG. 1) of fundamental mode energy of the thickness-extensional vibration (TE) mode.

In order to trap the fundamental mode energy of the thickness extensional vibration mode in the piezoelectric ceramic plate 2 in this known device, the effective Poisson's ratio $\sigma$ of the material which constitutes the piezoelectric ceramic plate 2 must be not less than $\frac{1}{3}$. When a material of the Pb (Zr, Ti) $O_3$ system is to be used as the material then in order for its Poisson's ratio taking such a value, the composition in the vicinity of the morphotropic phase boundary (M. P. B.) thereof must be used, as shown in FIG. 2.

Figure 2:
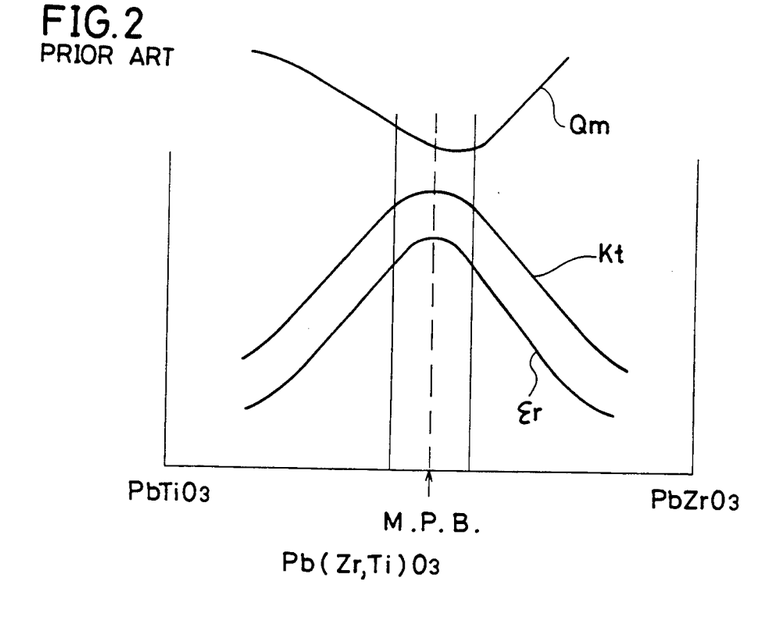
FIG. 2 is a diagram showing the relation between the composition of a material of the Pb (Zr, Ti) $O_3$ system and characteristics of the material.

On the other hand, as obvious from FIG. 2 the resulting filter will have undesirable characteristics such as a relatively large electromechanical coupling factor kt, a relatively large dielectric constant $\epsilon r$ and a somewhat small mechanical quality factor Qm when using such a composition in the vicinity of the morphotrophic phase boundary (M. P. B.) of the ceramics of the Pb (Zr, Ti) $O_3$ system.

Undesirably, various electrical characteristics such as the bandwidth, the selectivity, or the matching impedance of a ceramic filter are limited when the filter is restricted to a material having such characteristics. More specifically, it is very difficult to obtain a filter in which the bandwidth, the selectivity, the matching impedance and the like can be changed according to their usage.

Furthermore, the frequency of the filter device 1 shown in FIG. 1 is adjusted by grinding the piezoelectric ceramic plate 2 so as to reduce the thickness thereof to be equal to that of a standard product prior to forming the electrodes 3 to 5. When the filter is to be usable in the high frequency region at a frequency of 10 MHz or more, however, the thickness of the piezoelectric ceramic plate 2 must be reduced to 200 $\mu$m or less. Accordingly, the piezoelectric ceramic plate 2 is liable to be cracked and chipped at the time of the above described grinding. In addition, it is very difficult to phsically hold the piezoelectric ceramic plate 2 while, for example, forming the electrodes. Consequently, in the filter device 1 having the above described structure, the upper limit of the center frequency is limited to approximately 10 MHz.

The prior art publications available at Japanese Patent Laid-Open Gazette Nos. 85613/1983 and 85614/1983 disclose a monolithic piezoelectric ceramic filter in which a plurality of groups of electrodes which include a plurality of electrodes overlapping each other in the direction of thickness, are formed on a piezoelectric ceramic plate. In this monolithic piezoelectric ceramic filter, only a higher mode of thickness-extensional vibration is forced to be excited. These publication disclose a piezoelectric filter of an energy-trapped type which can be used in a high frequency region and uses a material having an effective Poisson's ratio of less than $\frac{1}{3}$. In this monolithic piezoelectric ceramic filter, however, the spurious response level is still large and distortion occurs in its waveform.

SUMMARY OF THE INVENTION

An object of the present invention is to provide a filter device having a structure with which various advantageous characteristics can easily be achieved and which is suitable for the use in a high frequency region and further, having a spurious response level which is effectively reduced.

The filter device according to the present invention comprises a piezoelectric filter of an energy-trapped type utilizing a higher harmonic in the thickness-extensional vibration mode, which comprises a plate-shaped body made of a piezoelectric-material and at least three electrodes arranged so as to be overlapped with each other and separated by layers of the piezoelectric-material in the direction of thickness of the plate-shaped body. The filter device is characterized in that at least one of the above electrodes comprises two divided electrodes which are divided in the same plane, at least one of the divided electrodes constituting an input electrode and at least one of the remaining divided electrodes constituting an output electrode, and in that a region around a vibrating region, where the electrodes are overlapped with each other, of the body is further subjected to polarization processing uniformly in the direction of thickness.

According to the present invention, at least three electrodes are arranged so as to be overlapped with each other in the direction of thickness of a plate-shaped body made of a piezoelectric-material. Accordingly, at least two layers of the piezoelectric-material interposed between the electrodes are vibrated. Consequently, a higher harmonic in the thickness-extensional vibration mode is trapped in the plate-shaped body. Since the higher harmonic in the thickness-extensional vibration mode is utilized, a filter device which can be used in a higher frequency region, as compared with a conventional filter device, can be constructed.

Furthermore, in a piezoelectric filter utilizing fundamental mode energy of the thickness-extensional vibration mode, when a piezoelectric-material of the lead titanate system and a material of the tetragonal system in the lead titanate zirconate system are used, the energy cannot be trapped. On the other hand, the piezoelectric filter according to the present invention has structure similar to that disclosed in the commonly owned co-pending U.S. patent application, Ser. No. 211,777 now U.S. Pat. No. 4,918,350 issued Apr. 17, 1990. Therefore, even in a case where a material of the composition is used in which energy-trapping-by-frequency-lowering type could not be conventionally achieved, a piezoelectric filter of an energy-trapped type can be constructed. Accordingly, a filter device suitable for high frequency applications can be provided using a material having a lower dielectric constant.

Advantageously, the electromechanical coupling factor kt is medium, the dielectric constant $\epsilon r$ is small and the mechanical quality factor Qm is large when using a material with an effective Poisson's ratio of less than $\frac{1}{3}$ as described above. Accordingly with this invention, it is also possible to narrow the passband, thereby making it possible to simply obtain a narrow-band filter for high-frequency applications.

Furthermore, not only the vibrating region but also the region around the vibrating region is subjected to polarization processing. Accordingly, spurious characteristics are substantially reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
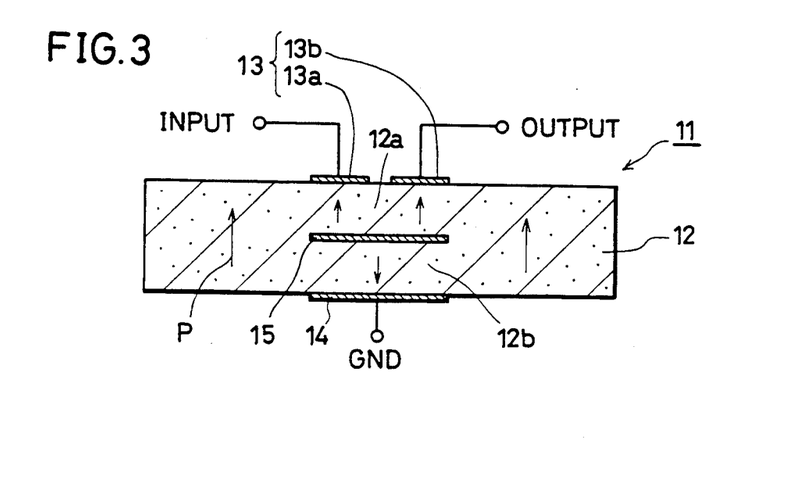
FIG. 3 is a cross sectional view illustrating a filter device according to a first embodiment of the present invention.

FIG. 3 is a cross sectional view illustrating a filter device according to a first embodiment of the present invention. In a filter device 11 according to the present embodiment, divided electrodes 13a and 13b are formed on the upper surface of a plate-shaped body 12 made of a piezoelectric-material of the Pb (Zr, Ti) $O_3$ system. An ground electrode 14 is formed on the lower surface of the plate-shaped body 12 so as to be opposed to the divided electrodes 13a and 13b on both sides thereof. In addition, an electrode 15 is formed inside of the plate-shaped body 12 so as to be overlapped with the divided electrodes 13a and 13b and the electrode 14 in the direction of thickness. More specifically, three layers of electrodes 13 to 15 including an electrode 13 comprising the divided electrodes 13a and 13b are provided in the body 12.

On the other hand, the plate-shaped body 12 is subjected to polarization processing in the direction represented by arrows as shown. More specifically, piezoelectric ceramic layers 12a and 12b in the upper and lower parts of the electrode 15 inside of the body 12 are subjected to polarization processing in opposite directions in the direction of thickness. Regions other than a region where the electrodes 13 to 15 are formed are subjected to polarization processing uniformly in the direction of thickness.

Consequently, a secondary higher harmonic in the thickness-extensional vibration mode is trapped in the piezoelectric ceramic layers 12a and 12b interposed between the electrodes 13 to 15 by using the divided electrode 13a as an input terminal, using the divided electrode 13b as an output terminal and connecting the electrode 14 on the lower surface to ground potential. Accordingly, a filter of an energy-trapped type in the double mode utilizing two modes, i.e., the A mode and the S mode is constructed.

In the filter device 11 according to the first embodiment, the secondary higher harmonic in the thickness-extensional vibration mode is trapped in the plate-shaped body 12. Accordingly, a filter device which can be used in a higher frequency region, as compared with a conventional filter device of a single plate type having the same thickness, can be easily achieved. Furthermore, as obvious from the contents disclosed in the following concrete example of experiment and the disclosure of the U.S. patent application Ser. No. 211,777, now U.S. Pat. No. 4,918,350 issued Apr. 17, 1990, even in a case where a material having an effective Poisson's ratio of less than $\frac{1}{3}$ is used, the secondary higher harmonic in the thickness-extentional vibration mode can be trapped. Consequently, the filter device 11 having various characteristics can be obtained without being restricted by characteristics of the material of the plate-shaped body 12.

Figure 4:
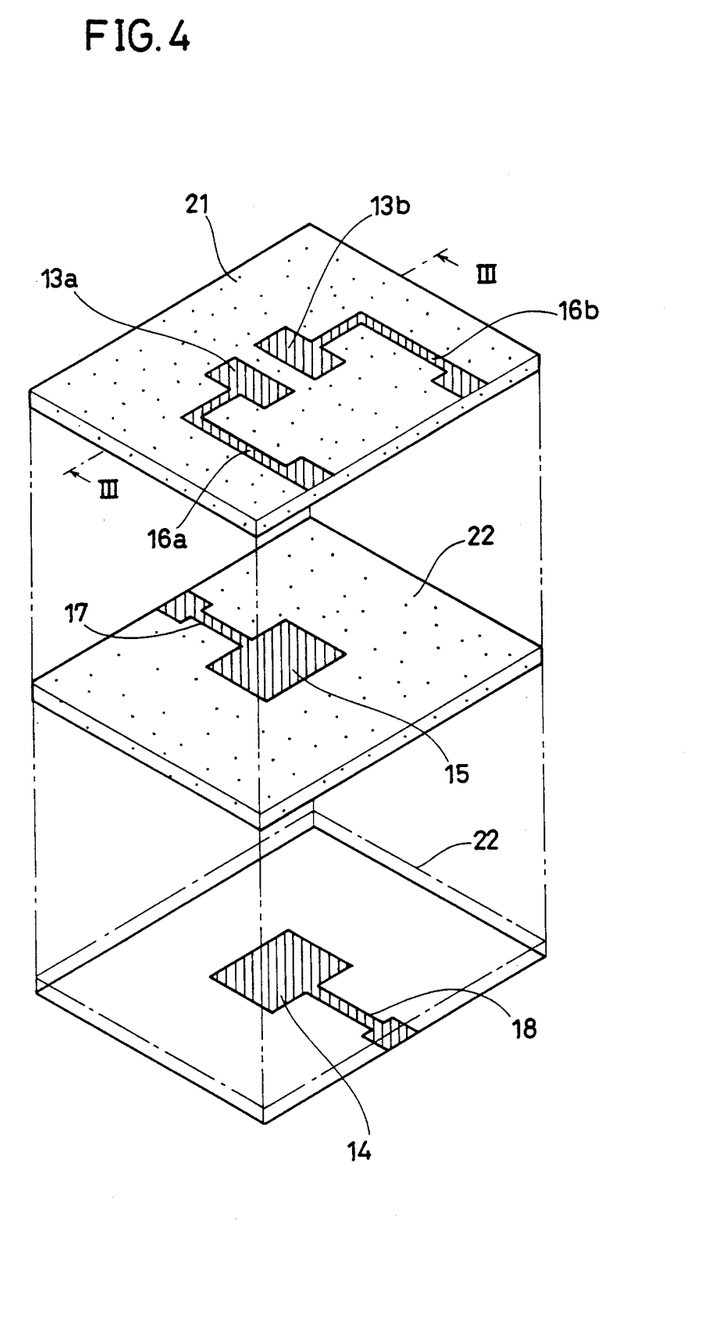
FIG. 4 is an exploded perspective view for explaining the arrangement of ceramic green sheets used for obtaining the filter device according to the first embodiment and the electrode patterns formed thereon.

Description is now made of a concrete example of experiment according to the first embodiment. As shown in FIG. 4, first and second ceramic green sheets 21 and 22, which will attain a thickness of 200 μm after sintering, each including as a component Pb{Zr$_{0.38}$Ti$_{0.52}$ (Mn$_{\frac{1}{3}}$Nb$_{\frac{2}{3}}$)$_{0.10}$} O$_3$ are prepared. An electrode paste is applied on the upper surface of the first ceramic green sheet 21, to form electrode paste portions 13a and 13b for divided electrodes and electrode paste portions 16a and 16b for connecting conductive portions (For simplicity of illustration, the same reference numerals as those of electrodes and connecting conductive portions after sintering are assigned to the electrode paste portions). In addition, an electrode paste is also applied on the upper surface of the second ceramic green sheet 22, to form an electrode paste portion 15 for an electrode and an electrode paste portion 17 for a connecting conductive portion. Furthermore, an electrode paste is applied to the lower surface of the second ceramic green sheet 22, to form an electrode paste portion 14 for an electrode and an electrode paste portion 18 for a connecting conductive portion.

Figure 5A:
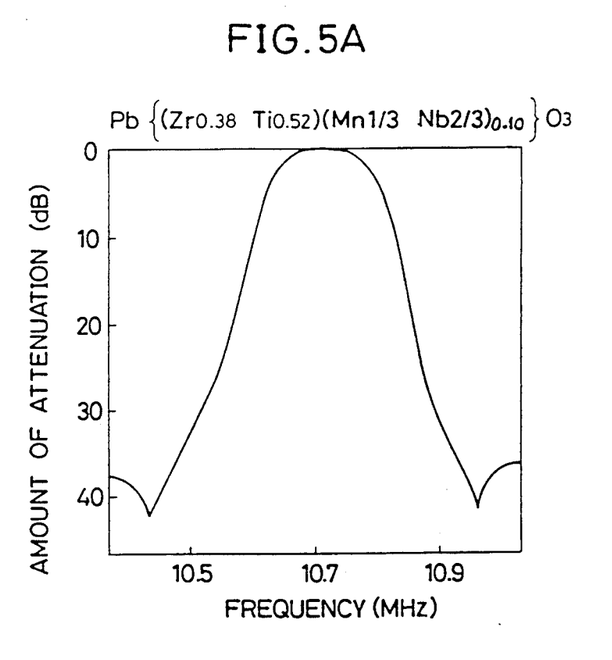
FIG. 5A is a diagram showing attenuation-frequency characteristics of the filter according to the first embodiment.

Then, the first and second ceramic green sheets 21 and 22 are laminated and then, sintered after applying pressure in the direction of thickness, to obtain a structure shown in FIG. 3. Thereafter, a positive potential is applied to the electrode 14 and a negative potential is applied to the divided electrodes 13a and 13b, thereby to subject the entire plate-shaped body 12 to polarization processing in a uniform manner as represented by an arrow P in FIG. 3. In addition, a negative potential is applied to the divided electrodes 13a and 13b and the vibrating electrode 14 on the lower surface and a positive potential is applied to the remaining electrode 15, thereby to subject the piezoelectric ceramic layers 12a and 12b interposed between the electrodes 13 to 15 to polarization processing in the direction represented by arrows as shown. Consequently, the filter device 11 being 3.5 mm × 3.5 mm by 400 μm thick is obtained. When attenuation-frequency characteristics thereof are measured, characteristics shown in FIG. 5A are obtained. The electrodes 14 and 15 measure 1.5 mm × 1.5 mm, and the divided electrodes 13a and 13b measure 0.7 mm × 1.5 mm.

As can be seen from FIG. 5A, according to the present embodiment, a filter device having a center frequency of 10 MHz, although it has a thickness of 400 μm, is obtained. In addition, the effective Poisson's ratio σ of the above described piezoelectric-material Pb{Zr$_{0.38}$Ti$_{0.52}$ (Mn$_{\frac{1}{3}}$Nb$_{\frac{2}{3}}$)$_{0.10}$} O$_3$ is less than $\frac{1}{3}$. For comparison, FIG. 5B shows attenuation-frequency characteristics of a filter device having exactly the same structure as that of the filter device shown in FIG. 3 except that a region around a vibrating region is not subjected to polarization processing.

Figure 5B:
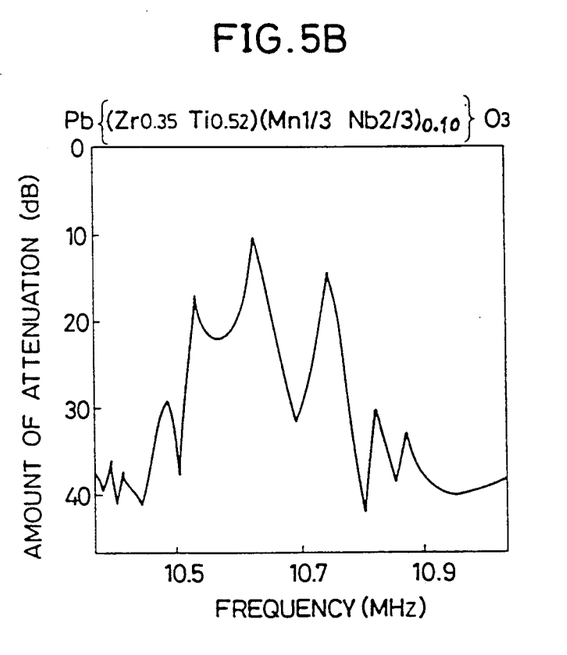
FIG. 5B is a diagram showing attenuation-frequency characteristics of a filter device having the structure shown in FIG. 3, in which a region around a vibrating region is not polarized.

Comparison of FIG. 5A with FIG. 5B shows that spurious responses can be effectively reduced by subjecting the region around the vibrating region to polarization processing.

Other embodiments of the present invention will be described. The same reference numerals are assigned to the same portions as those in the first embodiment and hence, the description thereof is not repeated.

Figure 6:
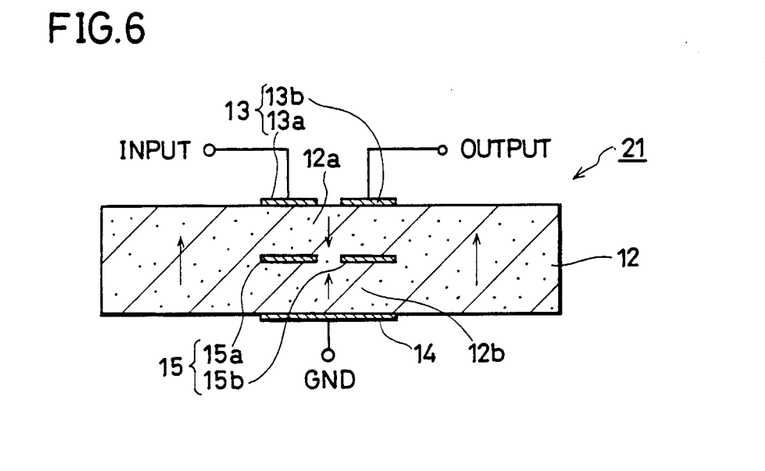
FIG. 6 is a cross sectional view illustrating a filter device according to a second embodiment of the present invention.

FIG. 6 is a cross sectional view illustrating a filter device according to a second embodiment of the present invention. In a filter device 21 according to the present embodiment, an electrode 15 formed inside of a plate-shaped body 12 comprises divided electrodes 15a and 15b which are divided in the same plane. Piezoelectric ceramic layers 12a and 12b on both sides of the divided electrodes 15a and 15b are subjected to polarization processing in the direction opposite to that in the first embodiment, as represented by arrows as shown. Consequently, the piezoelectric ceramic layers 12a and 12b may be polarized in either one of the directions in the first and second embodiments.

Figure 7:
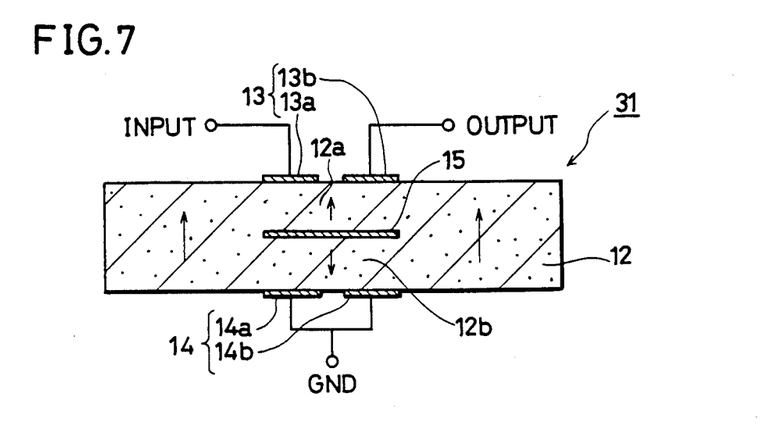
FIG. 7 is a cross sectional view illustrating a filter device according to a third embodiment of the present invention.

FIG. 7 is a cross sectional view illustrating a filter device according to a third embodiment of the present invention. In a filter device 31 according to the present embodiment, an electrode 14 on the lower surface of a plate-shaped body 12 is constituted by divided electrodes 14a and 14b. Consequently, electrodes formed on the upper and lower surfaces of the plate-shaped body 12 respectively comprise divided electrodes 13a and 13b and 14a and 14b, and an electrode 15 inside thereof comprises a single electrode. In the use of the filter device 31, the divided electrodes 14a and 14b on the lower surface are connected to each other by a line as shown to apply a common ground potential. Accordingly, the filter device 31 operates similarly to the filter device according to the first embodiment.

Figure 8:
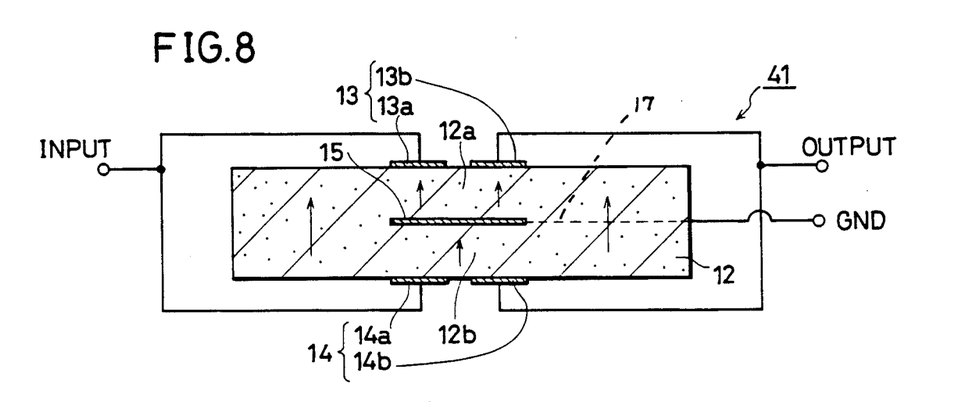
FIG. 8 is a cross sectional view illustrating a filter device according to a fourth embodiment of the present invention.

FIG. 8 is a cross sectional view illustrating a filter device according to a fourth embodiment of the present invention. In a filter device 41 according to the present embodiment, divided electrodes 13a, 13b, 14a and 14b are formed on the upper and lower surfaces of a plate-shaped body 12. Piezoelectric ceramic layers 12a and 12b are subjected to polarization processing in the same direction. More specifically, the filter device 41 according to the present embodiment is constructed by using the plate-shaped body 12 subjected to polarization processing uniformly in the direction of thickness, so that one polarization processing is sufficient.

In the use of the filter device 41, the respective one divided electrodes 13a and 14a out of the divided electrodes 13a to 14b formed on the upper and lower surfaces of the plate-shaped body 12 are pulled out together, to be used as an input electrode, the respective other divided electrodes 13b and 14b are pulled out together, to be used as an output electrode, and an electrode 15 inside of the plate-shaped body 12 is pulled out using a connecting conductive portion 17 (represented by a broken line), to be connected to a ground potential.

Meanwhile, the respective one divided electrodes 13a and 14a may be connected to each other and the respective other divided electrodes 13b and 14b may be connected to each other by using lead wires outside of the plate-shaped body 12, or by forming conductive patterns on the surface of the plate-shaped body 12. Also in the following embodiments, a plurality of divided electrodes and electrodes may be respectively connected to each other by lines using either one of the above described two kinds of connecting methods.

Figure 9:
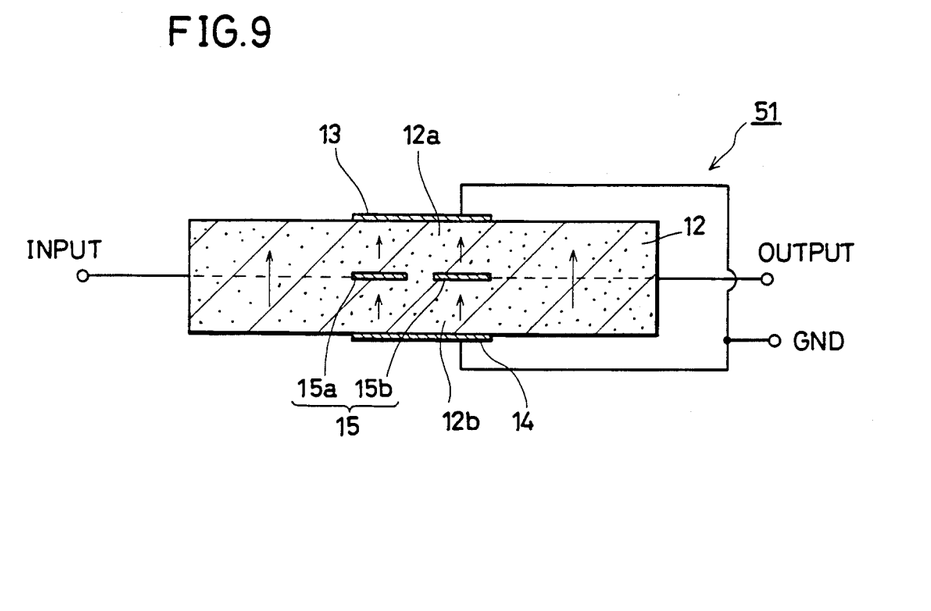
FIG. 9 is a cross sectional view illustrating a filter device according to a fifth embodiment of the present invention.

FIG. 9 is a cross sectional view illustrating a filter device according to a fifth embodiment of the present invention. In a filter device 51, a plate-shaped body 12 is subjected to polarization processing uniformly in the direction of thickness, each of electrodes 13 and 14 on the upper and lower surfaces thereof comprising a single electrode, and an electrode 15 inside thereof comprising divided electrodes 15a and 15b. In the use of the filter device 51, one of the divided electrodes 15a is used as an input electrode, while the other divided electrode 15b is used as an output electrode. The electrodes 13 and 14 on both surfaces thereof are connected to each other by a line, to be connected to a ground potential.

Figure 10:
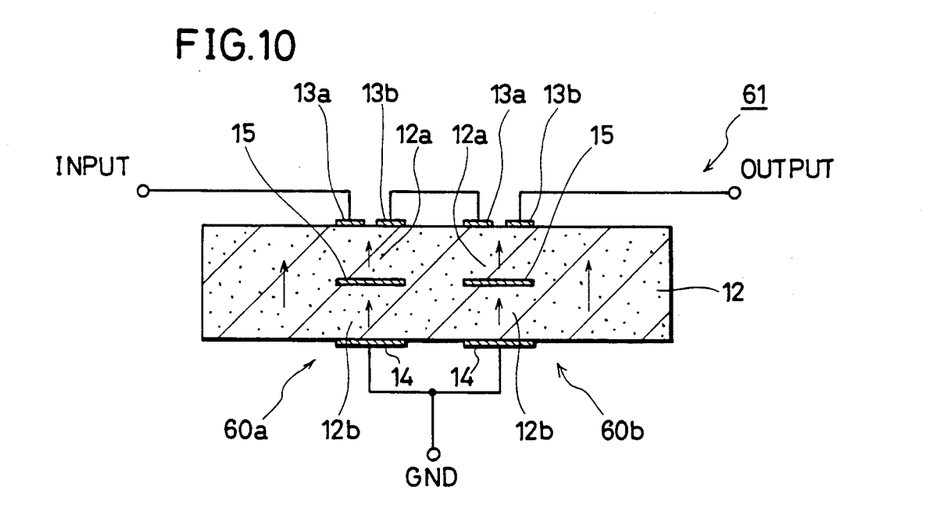
FIG. 10 is a cross sectional view for explaining a filter device according to a sixth embodiment, in which a plurality of filter elements are formed in a single plate-shaped body.

Although in the above described first to fifth embodiments, a single filter element is formed in a single plate-shaped body 12, two filter elements 60a and 60b may be formed in a single plate-shaped body 12 and connected to each other in a cascade manner, to construct a filter device 61, as shown in a cross sectional view of FIG. 10. The structure of each of the filter devices 60a and 60b is the same as that in the first embodiment as shown in FIG. 3.

Figure 11:
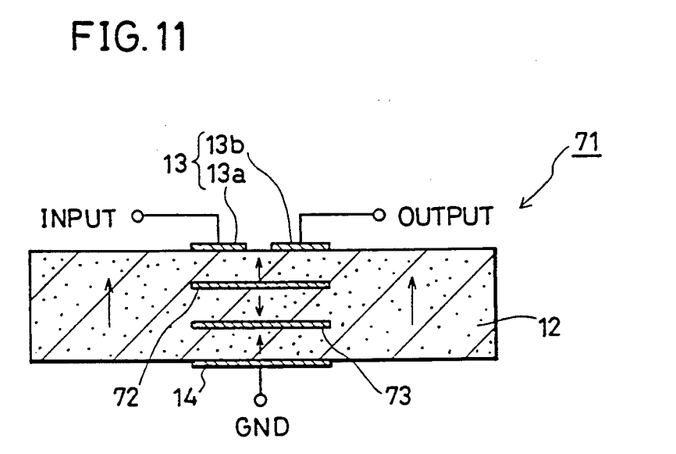
FIG. 11 is a cross sectional view illustrating a filter device utilizing a third harmonic according to a seventh embodiment of the present invention.

Furthermore, as shown in FIG. 11, a filter device 71 utilizing a third harmonic can be constructed by arranging a plurality of electrodes 72 and 73 inside of a plate-shaped body 12 and dividing the body 12 into three piezoelectric ceramic layers. Similarly, a filter device utilizing a fourth or more harmonic may be constructed by forming three or more electrodes in a plate-shaped body 12.

Figure 12:
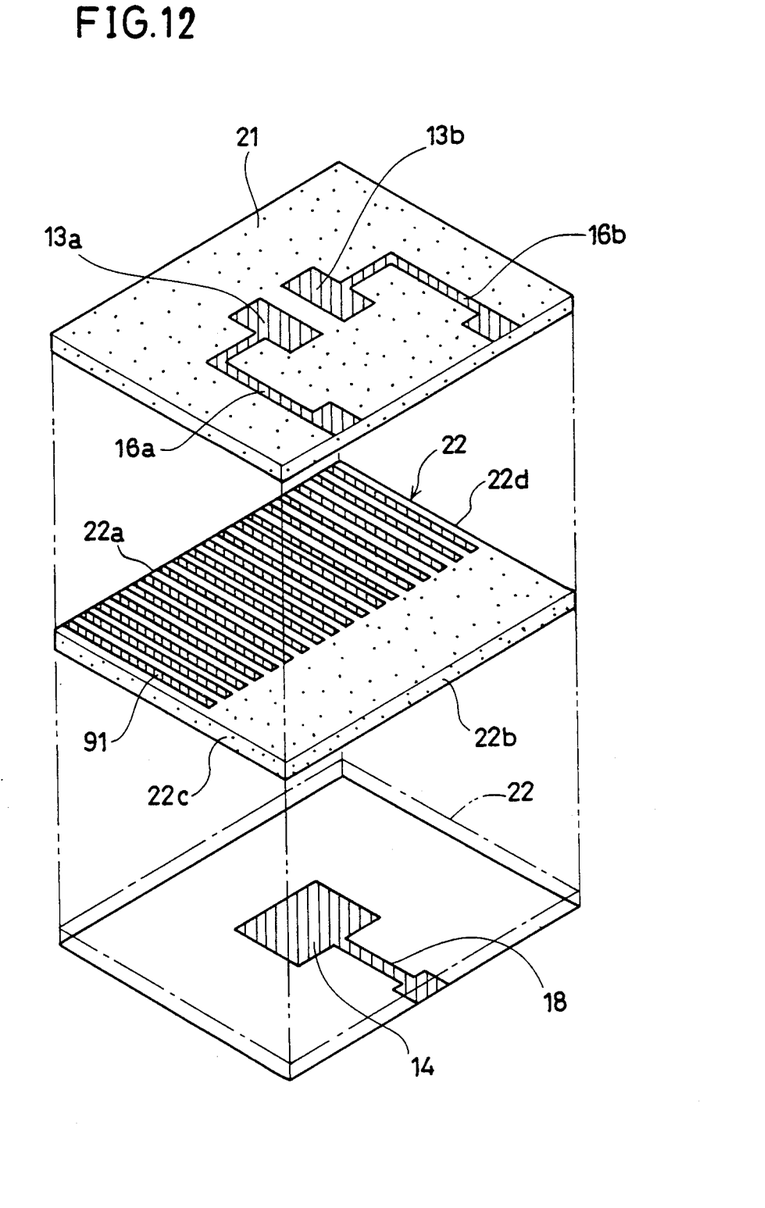
FIG. 12 is an exploded perspective view for explaining a filter device according to an eighth embodiment of the present invention.

FIG. 12 is an exploded perspective view for explaining a filter device according to an eighth embodiment of the present invention, which corresponds to FIG. 4 used for explaining the filter device according to the first embodiment of the present invention.

Referring to FIG. 12, in exactly the same manner as that in the first embodiment, a first ceramic green sheet 21 is prepared, and an electrode paste is applied on the upper surface thereof, to form electrode paste portions 13a and 13b for divided electrodes and electrode paste portions 16a and 16b for connecting conductive portions. In addition, a second ceramic green sheet 22 is prepared, and an electrode paste is applied on the lower surface thereof, to form an electrode paste portion 14 for an electrode and an electrode paste portion 18 for a connecting conductive portion. The steps so far described are the same as those shown in FIG. 4.

The filter device according to the eighth embodiment is obtained in the same manner as that in a case where the filter device according to the first embodiment is obtained except for the shapes of the electrodes formed on the upper surface of the second ceramic green sheet 22. More specifically, a plurality of linear electrode portions 91 are formed on the upper surface of the second ceramic green sheet 22 by applying an electrode paste. The plurality of linear electrode portions 91 are extended from one edge 22a of the ceramic green sheet 22 toward the other edge 22b thereof, but do not reach all the way to the other edge 22b. The reason for this is that the plurality of linear electrode portions 91 are overlapped with the connecting conductive portions 16a, 16b and 18 through layers of the piezoelectric-material when they are extended to the edge 22b beyond a region where they are overlapped with the electrodes 13 and 14, thereby causing unnecessary vibration. More specifically, the plurality of linear electrode portions 91 are extended until they attain such a length that they are not overlapped with the connecting conductive portions 16a, 16b and 18 through the layers of the piezoelectric-material.

The plurality of linear electrode portions 91 correspond to the electrode 15 shown in FIG. 4. In the present embodiment, a single electrode is constituted by the plurality of linear electrode portions 91. Accordingly, the divided electrodes 13a and 13b and the electrode 14 which are to be overlapped with the above electrode through the layers of the piezoelectric-material can be easily positioned. More specifically, even if the shift in overlapping slightly occurs, the areas of regions where the divided electrodes 13a and 13b and the electrode 14 are respectively overlapped with the plurality of linear electrode portions 91 become constant. Accordingly, it becomes easy to align each of the divided electrodes 13a and 13b and the electrode 14 with the linear electrode portions 91, respectively.

Although as illustrated in FIG. 12, the plurality of linear electrode portions 91 have a rectilinear shape, they may have a curved shape. In addition, the direction in which the linear electrode portions 91 are extended is not limited to the direction from the edge 22a toward the edge 22b. For example, the linear electrode portions 91 may be extended in another direction from the edge 22a or may be extended in a suitable direction from another edge 22c or 22d.

Figure 13A:
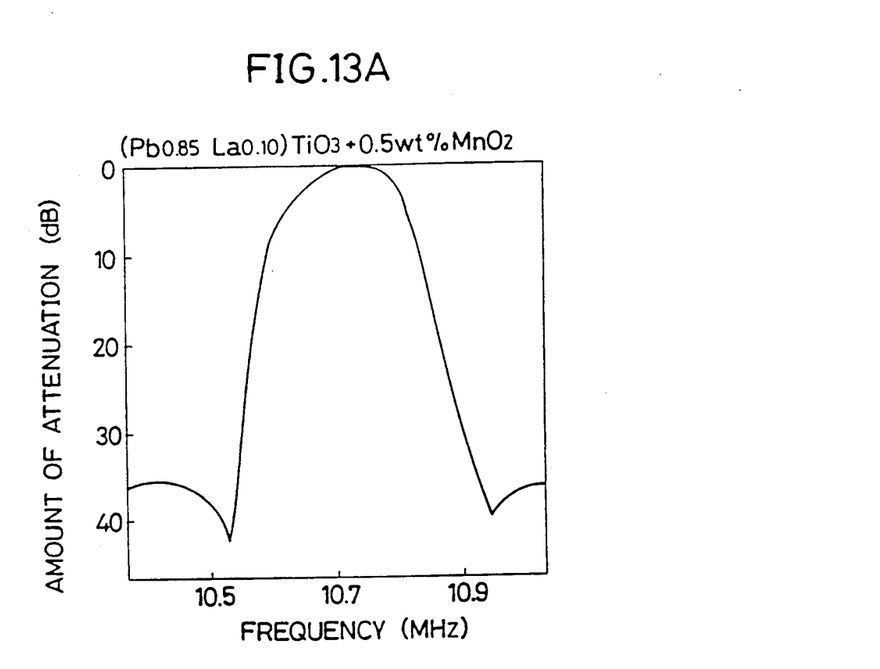
FIG. 13A is a diagram showing attenuation-frequency characteristics of a filter device having the structure shown in FIG. 3 in a case where a piezoelectric-material of the $PbTiO_3$ system is used.

In the above described embodiments, description was made of the filter device using the piezoelectric-material of the Pb (Zr, Ti) $O_3$ system. However, the plate-shaped body of the filter device can be formed of a piezoelectric-material of the lead titanate system. FIG. 13A shows attenuation-frequency characteristics of a filter device having the structure shown in FIG. 3 in a case where its plate-shaped body is formed of the piezoelectric-material of the lead titanate system. For comparison, FIG. 13B shows attenuation-frequency characteristics of a filter device having the structure shown in FIG. 3, in which a region around a vibrating region is not subjected to polarization processing, in a case where its plate-shaped body is formed of the piezoelectric-material of the lead titanate system.

Figure 13B:
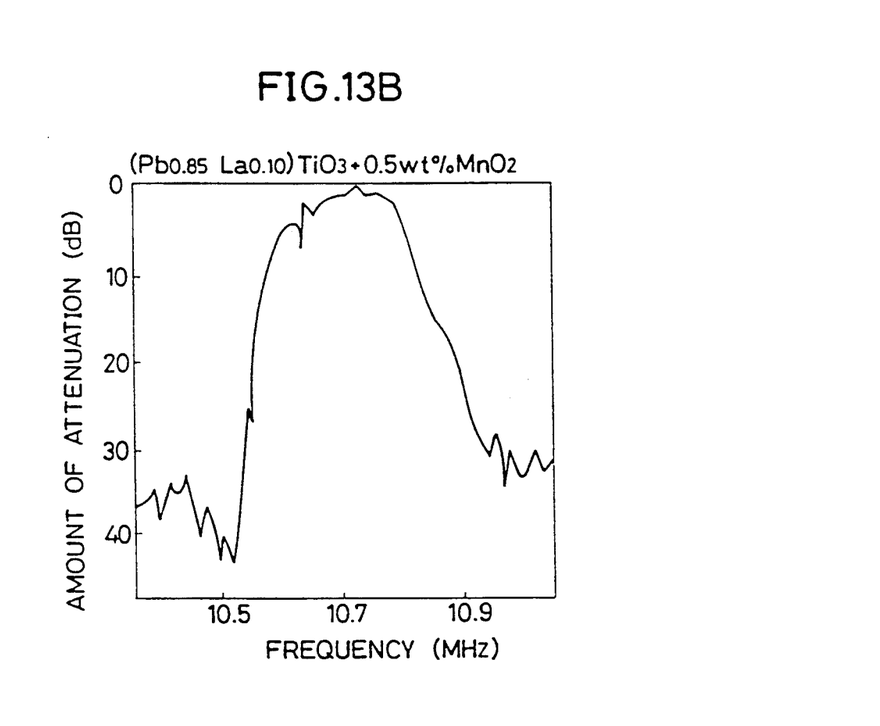
FIG. 13B is a diagram showing attenuation-frequency characteristics of a filter device having the structure shown in FIG. 3, in which a region around a vibrating region is not polarized.

As can be easily understood by comparing the characteristics shown in FIGS. 13A and 13B, even in a case where the plate-shaped body is made of the piezoelectric-material of the lead titanate system, spurious responses can be effectively reduced by subjecting the region around the vibrating region to polarization processing as shown in FIG. 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric filter device of an energy-trapping-by-frequency-lowering type utilizing a higher harmonic in a thickness-extensional vibration mode, comprising:
    a plate-shaped body made of a piezoelectric material; and
    at least three electrodes arranged in said filter device so as to be overlapped with each other while being separated by layers of the piezoelectric material in a direction of thickness of said plate-shaped body;
    at least one of said electrodes comprising a plurality of substantially coplanar divided electrodes, at least one of said divided electrodes constituting an input terminal of said filter device and at least one of the remaining divided electrodes constituting an output terminal of said filter device, and
    a region of said plate-shaped body, where the electrodes are overlapped with each other, defining an energy trapping-by-frequency lowering vibrating region; and a region of said body adjacent to said vibrating region comprising said piezoelectric material which has been subjected to polarization by electric potentials applied uniformly in the direction of thickness to reduce the sporious response of said vibration mode.

2. The filter device according to claim 1, wherein a plurality of layers of the piezoelectric-material forming said plate-shaped body are interposed between said electrodes and said plurality of layers are subjected to said polarization in alternately different directions in the direction of thickness.

3. The filter device according to claim 1, wherein a plurality of layers of the piezoelectric-material forming said plate-shaped body are interposed between said electrodes and said plurality of layers are subjected to said polarization in the same direction.

4. The filter device according to claim 1, wherein said piezoelectric-material has an effective Poisson's ratio such that the piezoelectric-material is unable to trap a fundamental mode energy of the thickness extensional vibration mode by lowering the resonance frequency.

5. The filter device according to claim 4, wherein said effective Poisson's ratio is less than $\frac{1}{3}$.

6. The filter device according to claim 1, wherein a single one of said at least three electrodes, other than the at least one electrode which comprises said divided electrodes, comprises a plurality of linear electrode portions formed spaced apart from each other by a predetermined distance.

7. The filter device according to claim 6, wherein said plurality of linear electrode portions comprise a plurality of linear electrodes of said filter device.

* * * * *